United States Patent
Sung et al.

(10) Patent No.: US 7,488,977 B2
(45) Date of Patent: Feb. 10, 2009

(54) DISPLAY DEVICE AND METHOD OF MANUFACTURING THE SAME

(75) Inventors: Un-cheol Sung, Anyang-si (KR); Hoon Kim, Hwaseong-si (KR); Sang-pil Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 382 days.

(21) Appl. No.: 11/486,831

(22) Filed: Jul. 14, 2006

(65) Prior Publication Data

US 2007/0080377 A1 Apr. 12, 2007

(30) Foreign Application Priority Data

Oct. 8, 2005 (KR) .................. 10-2005-0094666

(51) Int. Cl.
*H01L 31/00* (2006.01)
*H01L 31/0224* (2006.01)
*H01L 27/14* (2006.01)
*G02F 1/1343* (2006.01)

(52) U.S. Cl. ................ 257/59; 257/72; 257/431; 438/29; 438/30; 349/143

(58) Field of Classification Search ................ None
See application file for complete search history.

(56) References Cited

U.S. PATENT DOCUMENTS

2006/0044232 A1* 3/2006 Choi et al. ................ 345/76
2006/0197086 A1* 9/2006 Rhee et al. ................ 257/59

FOREIGN PATENT DOCUMENTS

| JP | 2005-158493 | 6/2005 |
|---|---|---|
| KR | 1020040094057 | 11/2004 |
| KR | 1020040104172 | 12/2004 |

* cited by examiner

*Primary Examiner*—Michelle R Connelly Cushwa
(74) *Attorney, Agent, or Firm*—Cantor Colburn LLP

(57) ABSTRACT

A display device, and method for making the same, comprising a thin film transistor formed on a first insulating substrate, a pixel electrode electrically connected to the thin film transistor, an organic layer formed on the pixel electrode, a common electrode formed on the organic layer, a conductive layer formed on the common electrode, a transparent electrode layer formed on the conductive layer, the transparent electrode being applied with a common voltage, and a second insulating substrate located on the transparent electrode layer. Thus, the present invention provides a display device to which common voltage is applied effectively.

23 Claims, 7 Drawing Sheets

DISPLAY REGION | NON-DISPLAY REGION

DISPLAY DEVICE AND METHOD OF MANUFACTURING THE SAME

This application claims priority to Korean Patent Application No. 2005-0094666, filed on Oct. 8, 2005, and all the benefits accruing therefrom under 35 U.S.C. §119, and the contents of which in its entirety are herein incorporated by reference.

BACKGROUND OF THE INVENTION

1. Field of the Invention

The present invention relates to a display device, and more particularly, to a display device to which a common voltage is applied effectively and a method of making the same.

2. Description of the Related Art

Organic light-emitting diode ("OLED") display devices are gaining popularity due to their advantageous features such as lower voltage drive, light weight, thinness, wide viewing angle, and high speed response as compared to other flat panel displays. OLED displays are classified into either passive matrix type or active matrix type. The passive matrix type has a simple structure, however power consumption is rapidly increased with display area and resolution. Thus, the passive matrix type of OLED display is primarily employed in small-sized applications. In contrast, the active matrix type display has the drawback of a complex manufacturing process, but has the advantage that it can be implemented with a wide screen and a high resolution.

In the active matrix type OLED thin film transistors ("TFTs") are connected with each pixel region and they control the light emission of an organic light-emitting layer of each respective pixel region. Pixel electrodes are also located in each pixel region, each of which is electrically separated from other adjacent pixel electrodes for independent drive. In addition, a bank, which stands higher than the pixel electrodes, is formed between the pixel regions and serves to prevent short circuits between the pixel electrodes and further serves as an insulator between the pixel regions. A hole injecting layer and an organic light-emitting layer are sequentially formed on the pixel electrode between the banks separating the pixel regions. A common electrode is then formed on the organic light-emitting layer.

OLED displays are further classified into bottom emission type and top emission type according to a direction of light generated from the organic light-emitting layer.

The bottom emission type of OLED display directs the light from the organic light-emitting layer in a direction toward the TFT. The process of manufacturing the bottom emission type is well established, but has an inherent problem in that its aperture ratio is decreased due to the TFT and the wiring requirements. In particular, the TFT using amorphous silicon is typically larger to provide sufficient current flow from source to drain due to its low electron mobility, and the aperture ratio of such an OLED, which generally employs two or more TFTs, is even further decreased.

The top emission type of OLED display directs the light from the organic light-emitting layer through the common electrode to the outside. Accordingly, the top emission type may be constructed with a larger aperture ratio. In the top emission type, the common electrode should be transparent. Currently, the transparent common electrode is made through a thin metal layer deposition method (e.g., sputtering) using materials such as indium tin oxide (ITO) or indium zinc oxide (IZO). However, when constructing large sized displays the current method of manufacturing produces a common electrode with too much resistance. This has been an impediment to creating larger displays.

BRIEF SUMMARY OF THE INVENTION

Accordingly, it is an aspect of the present invention to provide a display device to which a common voltage is effectively applied.

The foregoing and/or other aspects of the present invention can be achieved by an exemplary embodiment of a display device including a thin film transistor formed on a first insulating substrate, a pixel electrode electrically connected to the thin film transistor, an organic layer formed on the pixel electrode, a common electrode formed on the organic layer, a conductive layer formed on the common electrode, a transparent electrode layer formed on the conductive layer, the transparent electrode being applied with a common voltage, and a second insulating substrate located on the transparent electrode layer.

According to an exemplary embodiment of the present invention, the conductive layer may include a conductive polymer.

According to an exemplary embodiment of the present invention, the conductive layer may include at least one selected from the group consisting of polypyrrole, polyaniline and polythiophene.

According to an exemplary embodiment of the present invention, the conductive layer may include conductive particles.

According to an exemplary embodiment of the present invention, the conductive particles may include Ag or Ni.

According to an exemplary embodiment of the present invention, the conductive layer may be eliminated on the organic layer.

According to an exemplary embodiment of the present invention, an upper side of the conductive layer may be substantially flat.

According to an exemplary embodiment of the present invention, the common electrode may include Mg and Ag.

According to an exemplary embodiment of the present invention, the common electrode may include Ca and Ag.

According to an exemplary embodiment of the present invention, the common electrode is about 50 Å to about 200 Å thick.

According to an exemplary embodiment of the present invention, the transparent electrode layer may include indium tin oxide (ITO) or indium zinc oxide (IZO).

According to an exemplary embodiment of the present invention, light generated from the organic layer is directed through the second insulating substrate.

According to an exemplary embodiment of the present invention, the first insulating substrate may be provided thereon with a display region and a non-display region defined around the display region, and the non-display region may be formed with a non-conductive sealant for adjoining the first insulating substrate with the second insulating substrate.

According to an exemplary embodiment of the present invention, the non-conductive sealant contacts the transparent electrode layer.

According to an exemplary embodiment of the present invention, the first insulating substrate may be provided thereon with a display region and a non-display region defined around the display region, and the transparent electrode layer corresponds to the display region.

According to an exemplary embodiment of the present invention, the first insulating substrate may be provided thereon with a display region and a non-display region defined around the display region, and an insulating layer is formed between the non-display region and the conductive layer.

According to an exemplary embodiment of the present invention, the first insulating substrate may be provided thereon with a display region and a non-display region defined around the display region, and the non-display region may be formed with a shorting bar for applying a common voltage to the transparent electrode layer.

According to an exemplary embodiment of the present invention, the display device may further include a bank surrounding the organic layer.

According to an exemplary embodiment of the present invention, the organic layer may include a hole injecting layer and a light-emitting layer which are sequentially stacked thereon.

According to an exemplary embodiment of the present invention, the hole injecting layer may include poly (3,4-ethylenedioxythiophene) (PEDOT) and polystyrene sulfonic acid.

According to an exemplary embodiment of the present invention, the light-emitting layer may include a polymer. The foregoing and/or other aspects of the present invention can be achieved by an exemplary embodiment of a method of making a display device including forming a thin film transistor on a first insulating substrate, forming a pixel electrode electrically connected to the thin film transistor, forming an organic layer on the pixel electrode, forming a common electrode on the organic layer, forming a conductive layer on the common electrode, forming a transparent electrode layer for application of a common voltage on a second insulating substrate, and forming the second insulating substrate on the conductive layer, the transparent electrode layer being contacted with the conductive layer.

BRIEF DESCRIPTION OF THE DRAWINGS

The above and/or other aspects and advantages of the present invention will become apparent and more readily appreciated from the following detailed description of the exemplary embodiments, taken in conjunction with the accompanying drawings, in which.

DETAILED DESCRIPTION OF THE INVENTION

Figure 1:
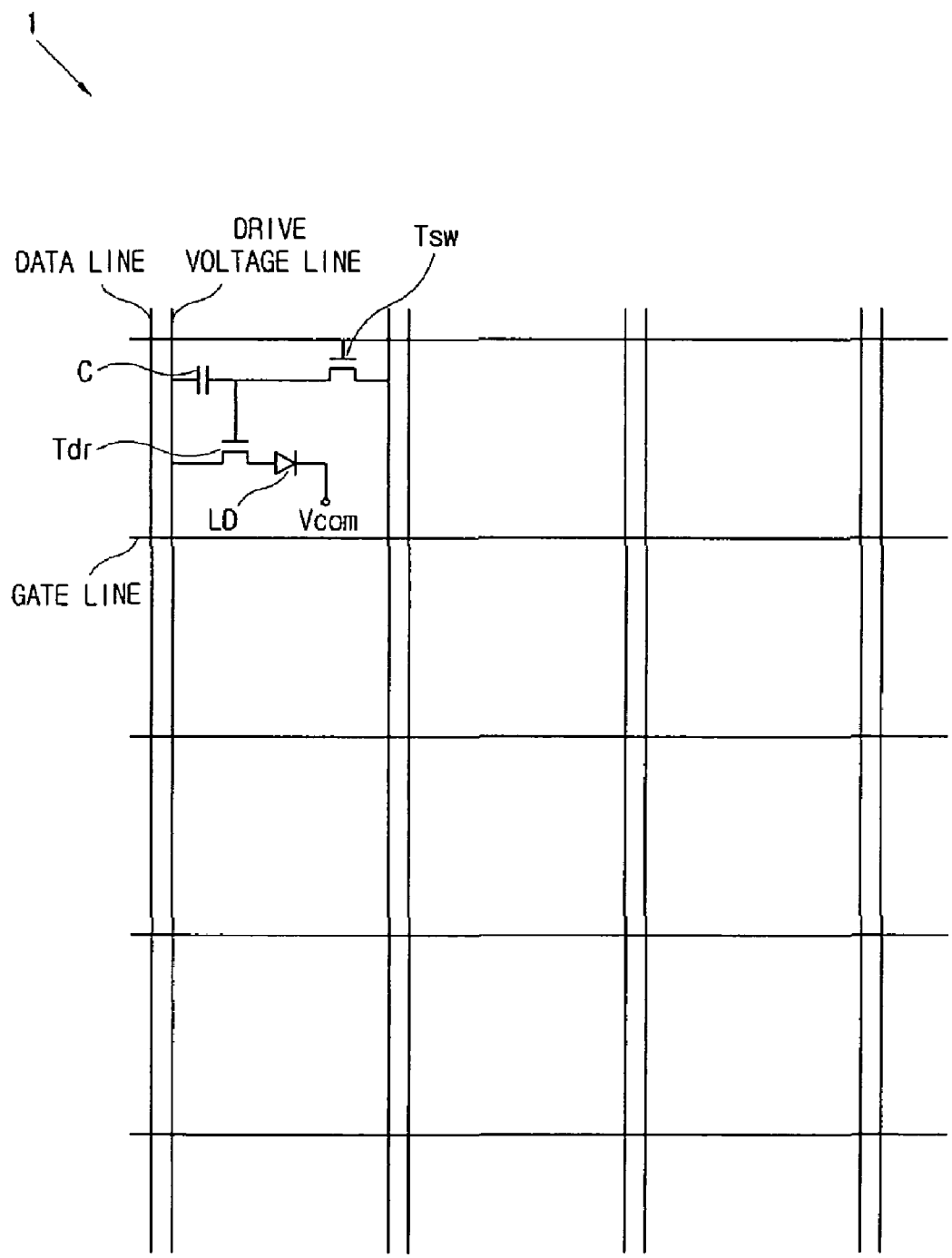
FIG. 1 is an equivalent circuit schematic diagram of an exemplary embodiment of a display device according to the present invention.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is an equivalent circuit schematic diagram of an exemplary embodiment of a display device according to the present invention.

Referring to FIG. 1, a display device 1 according to this exemplary embodiment includes a plurality of signal lines. The signal lines include a gate line for transmitting a scan signal, a data line for transmitting a data signal, and a drive voltage line for transmitting a drive voltage. The data line and the drive voltage line are arranged adjacent and in parallel to each other, and the gate line is extended perpendicular to the data line and the drive voltage line.

Each pixel includes an organic light-emitting element LD, a switching transistor Tsw, a drive transistor Tdr and a capacitor C.

The drive transistor Tdr has a control terminal connected to the switching transistor Tsw, an input terminal connected to the drive voltage line, and an output terminal connected to the organic light-emitting element LD.

The organic light-emitting element LD has an anode connected to the output terminal of the drive transistor Tdr and a cathode connected to the common voltage Vcom. The organic light-emitting element LD displays images by emitting light with different intensity depending on the output current of drive transistor Tdr. The magnitude of the current of drive transistor Tdr varies depending on the voltage applied between the control terminal and the output terminal.

The switching transistor Tsw also has a control terminal connected to the gate line, an input terminal connected to the data line, and an output terminal connected to the control terminal of drive transistor Tdr. The switching transistor Tsw transmits the data signal applied to the data line to the drive transistor Tdr according to the scan signal applied to the gate line.

The capacitor C is connected between the control terminal of the drive transistor Tdr, and the drive voltage line. The capacitor C is also connected between the drive voltage line and the output terminal of the switching transistor Tsw. The capacitor C charges and maintains the data signal inputted to the control terminal of drive transistor Tdr.

Figure 2:
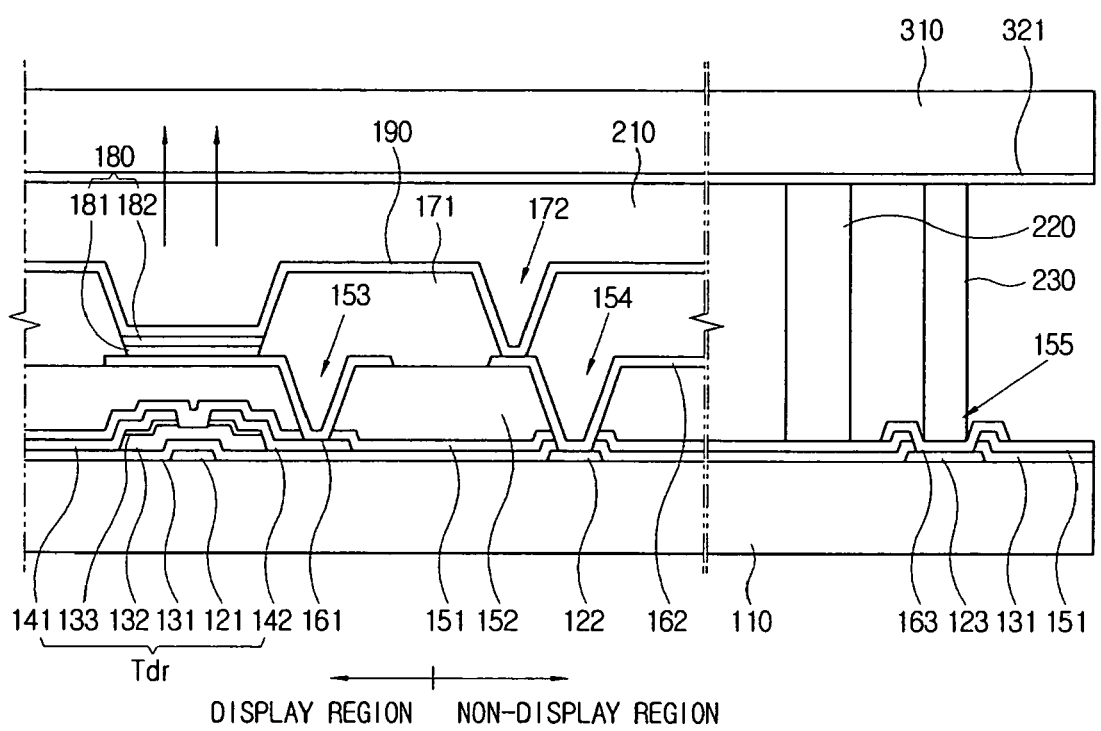
FIG. 2 is a partial cross-sectional view of the exemplary embodiment of the display device of FIG. 1 according to the present invention.
Figure 3:
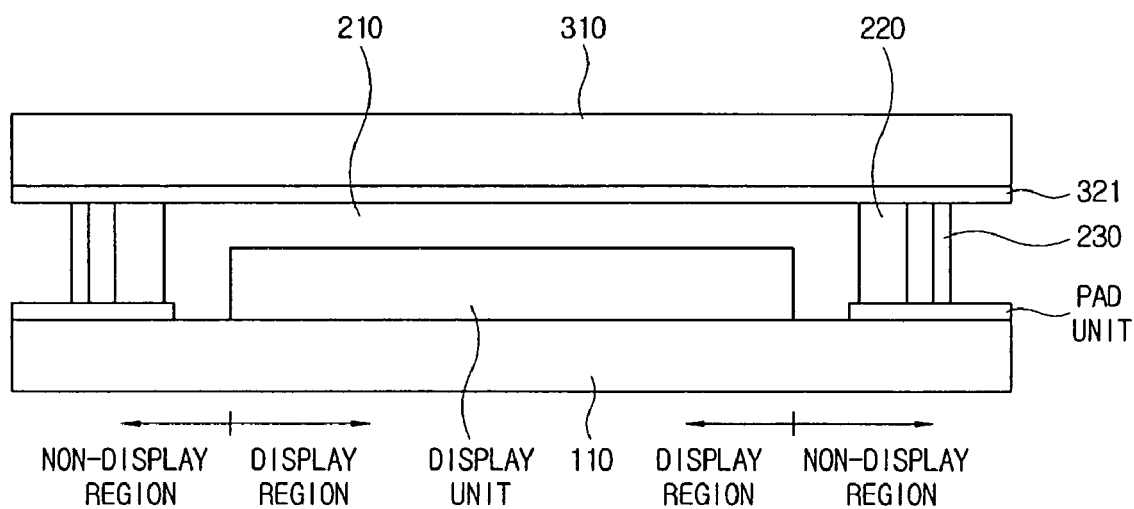
FIG. 3 is a full cross-sectional view of the exemplary embodiment of the display device of FIGS. 1 and 2 according to the present invention.

The display device according to the present exemplary embodiment will be described below in more detail with reference to FIGS. 2 and 3. FIG. 2 is a partial cross section view of the present exemplary embodiment of the display device according to the present invention. FIG. 3 is a full cross-section view of the present exemplary embodiment of the display device according to the present invention. FIG. 2 shows a drive transistor Tdr, while a switching transistor Tsw is not shown.

A first insulating substrate 110 made of insulating material comprising glass, quartz, ceramic, or plastic is formed with a gate electrode 121, a first common voltage application unit 122 and a second common voltage application unit 123 thereon. The first common voltage application unit 122 and the second common voltage application unit 123 are applied with a common voltage from the outside, and apply the common voltage to a common electrode 190 and a transparent electrode layer 321, respectively. The gate electrode 121, the first common voltage application unit 122 and the second common voltage application unit 123 are provided in the same layer, and the first common voltage application unit 122 and the second common voltage application unit 123 are located in a non-display region.

A gate insulating film 131 including silicon nitride SiNx or a similar substance is formed on the first insulating substrate 110 and the gate electrode 121. The gate insulating film 131 is formed only partially on the first common voltage application unit 122 and the second common voltage application unit 123.

A semiconductor layer 132 including amorphous silicon and a resistive contact layer 133 comprising n+ hydrated amorphous silicon which is highly doped with n-type impurities are sequentially formed on the gate insulating film 131 above and proximate to the gate electrode 121. The resistive contact layer 133 is separated into two parts with respect to the gate electrode 121.

A source electrode 141 and a drain electrode 142 are formed on the resistive contact layer 133 and the insulating film 131. The source electrode 141 and the drain electrode 142 are separated into two parts leaving a gap above the gate electrode 121.

A passivation film 151 is formed on top of the source electrode 141, the drain electrode 142, and the upper side of the semiconductor layer 132, which was left uncovered by the gap between the source electrode 141 and the drain electrode 142. The passivation film 151 may comprise silicon nitride SiNx. The passivation film 151 does not fully overlay the drain electrode 142, the first common voltage application unit 122 and the second common voltage application unit 123.

An organic film 152 is formed on the passivation film 151. The type of organic film 152 may include one of benzocyclobutene (BCB), olefin, acrylic resin, polyimide, TEFLON® (commercially available from Du Pont), cytop, or perfuorocyclobutane (PFCB). The organic film 152 is partially eliminated on the drain electrode 142, the first common voltage application unit 122 and the second common voltage application unit 123.

A pixel electrode 161 is formed on the upper side of the organic film 152. The pixel electrode 161, which is also called an anode, supplies holes to the organic layer 180. The pixel electrode 161, comprising a transparent conductive material such as indium tin oxide (ITO) or indium zinc oxide (IZO), is connected through a contact hole 153 to the drain electrode 142.

A first contact member 162 and a second contact member 163 are formed in the same layer as the pixel electrode 161 and are located on the first common voltage application unit 122 and the second common voltage application unit 123, respectively. The first contact member 162 is connected through a contact hole 154 to the first common voltage application unit 122, and the second contact member 163 is connected through a contact hole 155 to the second common voltage application unit 123.

A bank 171 is formed on the pixel electrode 161 and the organic film 152. The bank 171 surrounding the pixel electrode 161 defines a pixel region. Further, the bank 171 serves to prevent short circuits between the source electrode 141 of the drive transistor Tdr and the common electrode 190, and also between the drain electrode 142 of the drive transistor Tdr and the common electrode 190, respectively. The bank 171 may comprise photosensitive materials such as acryl resin, polyimide resin with thermal resistance and solubility resistance, or inorganic materials such as $SiO_2$, $TiO_2$, etc., and may also be made in a two-layer structure of an organic layer and an inorganic layer. The bank 171 is formed with a contact hole 172 exposing the first contact member 162.

An organic layer 180 is formed on the portion of the pixel electrode 161 which was uncovered by the bank 171. The organic layer 180 comprises a hole injecting layer 181 and a light-emitting layer 182.

The hole injecting layer 181 may be formed by the ink-jetting method using a water phase suspension formed by mixing water with the hole injecting materials. The hole injecting materials may comprise poly (3,4-ethylenedioxythiophene) (PEDOT) and polystyrene sulfonic acid (PSS).

The light-emitting layer 182 may employ polymers such as polyfluorene derivatives, poly(paraphenylene-vinylene) derivatives, polyphenylene derivatives, polyvinyl carbazole, polythiophene derivatives, or molecular materials doped with phenylene type pigment, rodamine type pigment, rubrene, phenylene, 9,10-diphenylanthracene, tetraphenylbutadiene, nile red, coumarin 6, quinacridone, or similar materials.

The hole from the pixel electrode 161 and the electron from the common electrode 190 are combined with each other in the light-emitting layer 182 to become an exciton, and then the light is generated in the process of inactivation of the exciton.

The common electrode 190 is located on the bank 171 and light-emitting layer 182. The common electrode 190, which is also called a cathode, supplies electrons to the light-emitting layer 182. The common electrode 190, which may comprise an alloy of Mg and Ag, or Ca and Ag, may be about 50 Å to about 200 Å thick. If the common electrode 190 is less than about 50 Å thick, then the electrical resistance is excessively increased and the common voltage is not applied effectively. If the common electrode 190 is more than about 200 Å thick, then the common electrode 190 may be opaque.

The common electrode 190 is connected through the contact hole 172 to the first contact member 162. The first contact member 162 is connected to the first common voltage application unit 122, and thus the common electrode 190 is applied with the common voltage. Meanwhile, the first common voltage application unit 122 is located outside of the display region, and thus a voltage drop is generated in the common electrode 190 away from the first common voltage application unit 122. In the case of a top-emission type display, in which the light from the light-emitting layer 182 passes through the common electrode 190, the thickness of the common electrode 190 is limited to prevent brightness deterioration, thereby increasing the resistance of common electrode 190 and making the problem of voltage drop worse.

Although not shown in the drawing, the common electrode 190 may be composed of two layers, the lower layer of which may comprise an alloy of metals, and the upper layer of which may be made of an ITO layer or an IZO layer. The ITO layer or IZO layer is formed by a low-temperature deposition method to protect the lower organic layer 180 from the temperature or plasma associated with other ITO or IZO formation methods. The low-temperature deposition method cannot solve the above voltage drop problem since the ITO layer or IZO layer formed by the low-temperature deposition method has poor film quality and increases resistivity.

A conductive layer 210 is located on the common electrode 190. The conductive layer 210, which electrically connects the transparent electrode layer 321 with the common electrode 190, is formed substantially flat. In a first exemplary embodiment, the conductive layer 210 comprises conductive polymers, such as polypyrrole, polyaniline, polythiophene and similar materials.

The transparent electrode layer 321 and a second insulating substrate 310 are located on the upper side of the conductive layer 210. The second insulating substrate 310 may comprise glass or transparent plastic. The transparent electrode layer 321 comprises ITO or IZO and is formed under the entirety of the second insulating substrate 310.

The second insulating substrate 310 and the transparent electrode layer 321 may be manufactured separately to adjoin on the conductive layer 210. In such an embodiment, the transparent electrode layer 321 may be formed by high-temperature deposition to produce a high quality film since it may be formed without concern for the deterioration of organic layer 180. Accordingly, the transparent electrode layer 321 maintains a relatively uniform common voltage regardless of the distance from the second common voltage application unit 123.

The transparent electrode layer 321 is connected through a shorting bar 230 to the second contact member 163 covering the second common voltage application unit 123.

The transparent electrode layer 321 transmits the common voltage to the common electrode 190 through the conductive layer 210, and thus the common electrode 190 can effectively apply the common voltage to the organic layer 180.

The first insulating substrate 110 and the second insulating substrate 310 are attached to each other through a sealant 220 formed in the non-display region. The sealant 220 is non-conductive and may comprise acryl resin and/or epoxy resin.

Referring to FIG. 3, the display region on which the organic layer 180 is located, is covered with the conductive layer 210, a "pad unit" and shorting bar 230 applied with the drive signal and common voltage from the exterior are located in the non-display region.

Figure 4:
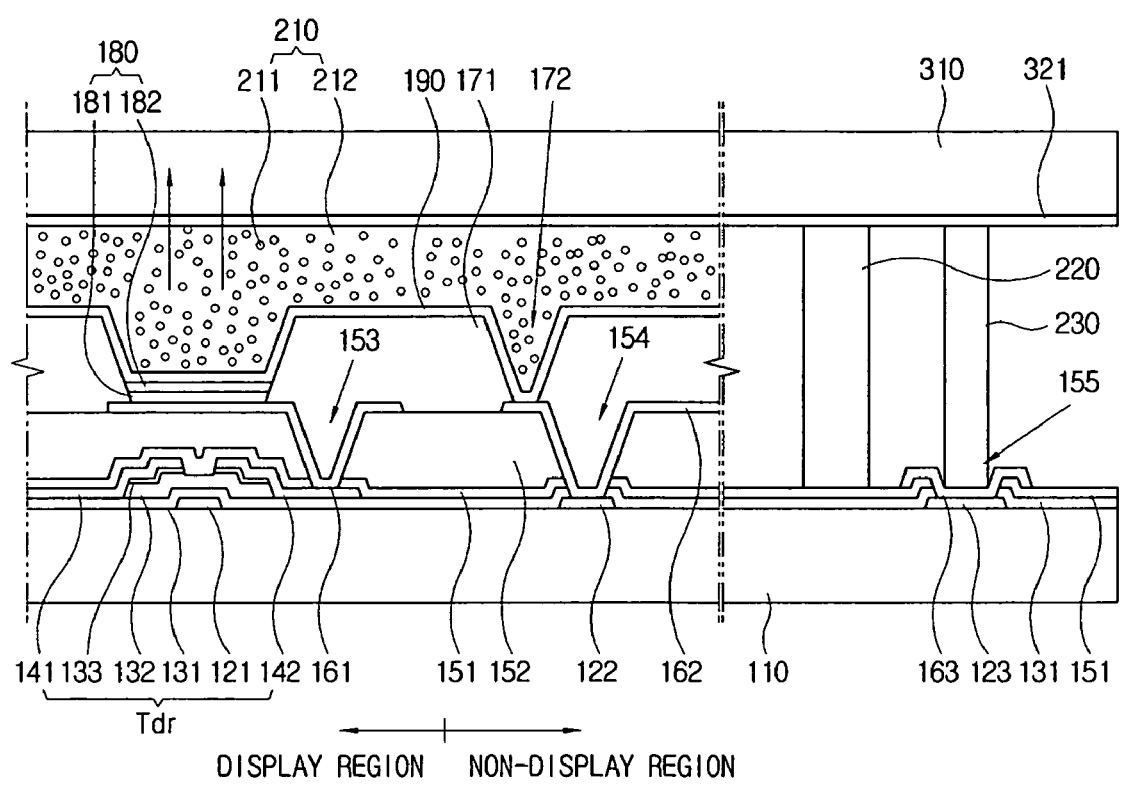
FIG. 4 is a partial cross-sectional view of another exemplary embodiment of a display device according to the present invention.
Figure 5:
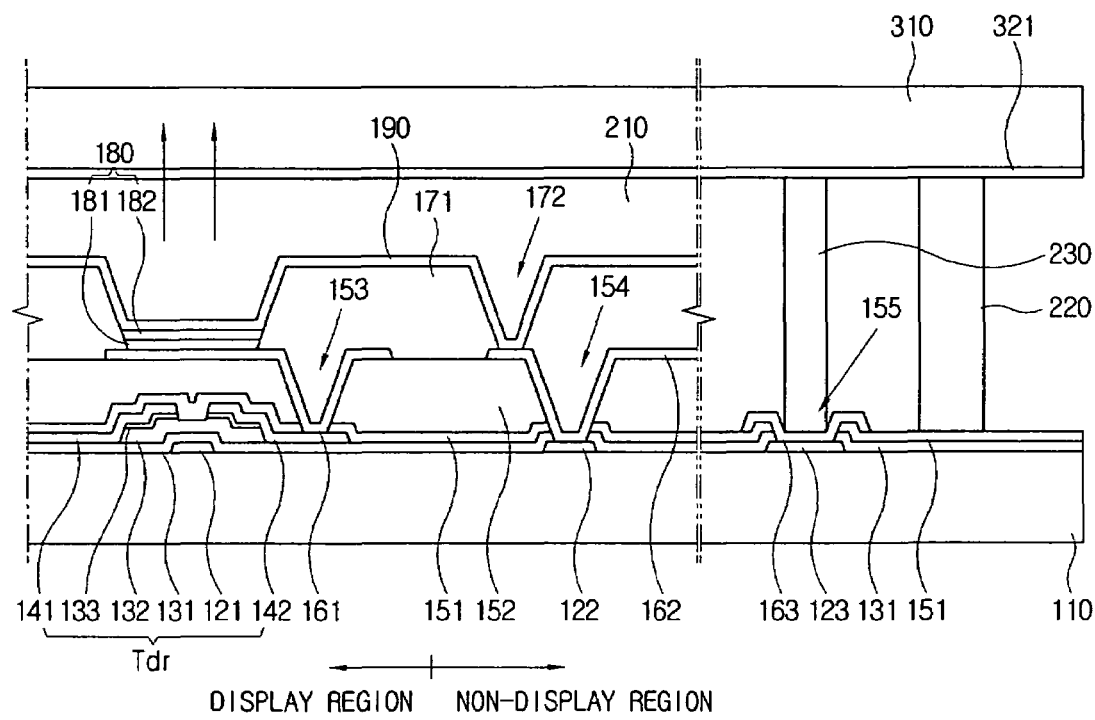
FIG. 5 is a partial cross-sectional view of yet another exemplary embodiment of a display device according to the present invention.
Figure 6:
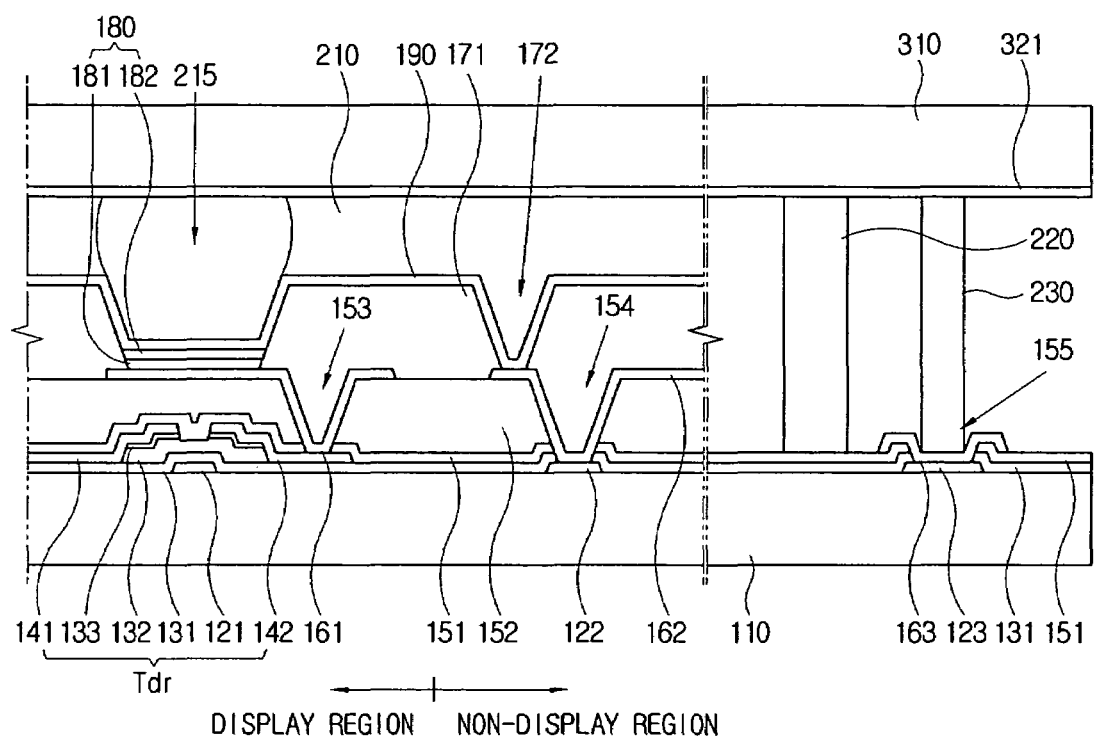
FIG. 6 is a partial cross-sectional view of still another exemplary embodiment of a display device according to the present invention.

FIGS. 4, 5, and 6 are partial cross-sectional views of alternative exemplary embodiments of a display device, respectively, according to the present invention.

In the display device according to the exemplary embodiment shown in FIG. 4, the conductive layer 210 comprises conductive particles 211 and a polymer 212. The conductive particles 211 comprise Ni or Ag, and have a very small diameter for purposes of transparency. The polymer 212 may comprise a conductive polymer or have the same composition as the organic film 152. According to the present exemplary embodiment, the electrical connection of the common electrode 190 and the transparent electrode layer 321 is enhanced by the conductive particles 211.

In the display device according to another alternative exemplary embodiment shown in FIG. 5, the shorting bar 230 is arranged closer to the display region than to the sealant 220. It is preferred that the first common voltage application unit 122 and the second common voltage application unit 123 are provided in plurality around the display region. On the other hand, it is possible that the first common voltage application unit 122 and the second common voltage application unit 123 are provided integrally.

The conductive layer 210 of the display device according to yet another alternative exemplary embodiment shown in FIG. 6 is provided with a depression part 215 formed above the organic layer 180. The brightness of the light is improved since the light from the organic layer 180 is allowed to pass to the transparent electrode layer 321 without first having to pass through the conductive layer 210. In such an embodiment it is preferred that the conductive layer 210 is made black, e.g., by using pigment and the like, so that the conductive layer 210 can serve as a black matrix.

Although the conductive layer 210 in the present exemplary embodiment is opaque, its aperture ratio or brightness is not affected. Accordingly, if the conductive layer 210 includes conductive particles 211 as in FIG. 5, the size or density of the conductive particles 211 can be increased, thus making it possible to enhance the electrical connection between the common electrode 190 and transparent electrode layer 321.

Figure 7:
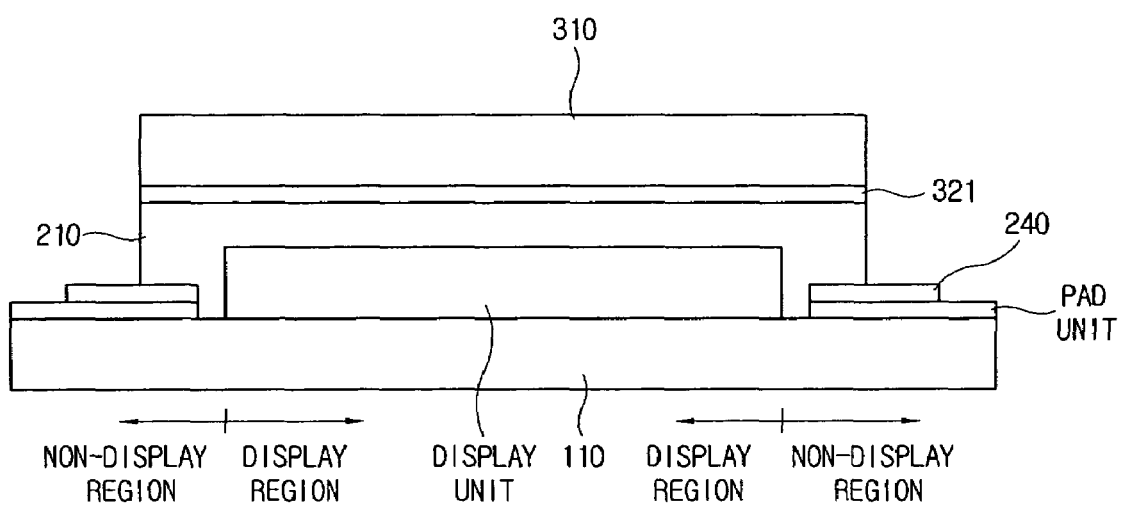
FIG. 7 is a full cross-sectional diagram of a display device according to still yet another exemplary embodiment of the present invention.

FIG. 7 is a full cross-section view of still yet another alternative exemplary embodiment of a display device according to the present invention. The second insulating substrate 310 of the display device according to this exemplary embodiment is formed with a slightly smaller width compared to a width of the first insulating substrate 110, as illustrated. The larger width of the first insulating substrate 110 facilitates connection of the external circuit to the pad unit. Meanwhile, an insulating layer 240 is formed between the pad unit and the conductive layer 210. The insulating layer 240 may comprise a silicon nitride layer. Although not shown in the drawing, the common electrode 190 and the transparent electrode layer 321 are electrically connected to the common voltage application units 122 and 123, respectively.

As fully described above, a display device is provided to which a common voltage is effectively applied.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A display device comprising:
    a thin film transistor formed on a first insulating substrate;
    a pixel electrode electrically connected to the thin film transistor;
    an organic layer formed on the pixel electrode;
    a common electrode formed on the organic layer;
    a conductive layer formed on the common electrode;
    a transparent electrode layer formed on the conductive layer for application of a common voltage; and
    a second insulating substrate located on the transparent electrode layer.

2. The display device according to claim 1, wherein the conductive layer comprises a conductive polymer.

3. The display device according to claim 2, wherein the conductive layer comprises at least one selected from the group consisting of polypyrrole, polyaniline and polythiophene.

4. The display device according to claim 1, wherein the conductive layer comprises conductive particles.

5. The display device according to claim 4, wherein the conductive particles comprise Ag or Ni.

6. The display device according to claim 1, wherein the conductive layer is eliminated on the organic layer.

7. The display device according to claim 1, wherein an upper side of the conductive layer is substantially flat.

8. The display device according to claim 1, wherein the common electrode comprises Mg and Ag.

9. The display device according to claim 1, wherein the common electrode comprises Ca and Ag.

10. The display device according to claim 1, wherein the common electrode is about 50 Å A to about 200 Å thick.

11. The display device according to claim 1, wherein the transparent electrode layer comprises indium tin oxide (ITO) or indium zinc oxide (IZO).

12. The display device according to claim 1, wherein light generated from the organic layer is directed through the second insulating substrate to an outside.

13. The display device according to claim 1, wherein the first insulating substrate is provided thereon with a display region and a non-display region defined around the display region, and the non-display region is formed with a non-conductive sealant for adjoining the first insulating substrate with the second insulating substrate.

14. The display device according to claim 13, wherein the non-conductive sealant contacts the transparent electrode layer.

15. The display device according to claim 1, wherein the first insulating substrate is provided thereon with a display region and a non-display region defined around the display region, and the transparent electrode layer corresponds to the display region.

16. The display device according to claim 1, wherein the first insulating substrate is provided thereon with a display region and a non-display region defined around the display region, and an insulating layer is formed between the non-display region and the conductive layer.

17. The display device according to claim 1, wherein the first insulating is provided thereon with a display region and a non-display region defined around the display region, and the non-display region is formed with a shorting bar for applying a common voltage to the transparent electrode layer.

18. The display device according to claim 1, further comprising:
    a bank surrounding the organic layer.

19. The display device according to claim 1, wherein the organic layer comprises a hole injecting layer and a light-emitting layer.

20. The display device according to claim 19, wherein the hole injecting layer and the light-emitting layer are sequentially stacked thereon.

21. The display device according to claim 19, wherein the hole injecting layer comprises poly (3,4-ethylenedioxythiophene)(PEDOT) and polystyrene sulfonic acid.

22. The display device according to claim 19, wherein the light-emitting layer comprises a polymer.

23. A method of making a display device comprising:
    forming a thin film transistor on a first insulating substrate;
    forming a pixel electrode electrically connected to the thin film transistor;
    forming an organic layer on the pixel electrode;
    forming a common electrode on the organic layer;
    forming a conductive layer on the common electrode;
    forming a transparent electrode layer for application of common voltage on a second insulating substrate; and
    forming the second insulating substrate on the conductive layer, the transparent electrode layer being contacted with the conductive layer.

* * * * *